US012785008B2

(12) United States Patent
Saito et al.

(10) Patent No.: US 12,785,008 B2
(45) Date of Patent: Nov. 3, 2026

(54) ELECTRONIC DEVICE

(71) Applicant: CASIO COMPUTER CO., LTD., Tokyo (JP)

(72) Inventors: Yuta Saito, Tokyo (JP); Sae Uchibayashi, Tokyo (JP); Naoto Fukushima, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 289 days.

(21) Appl. No.: 18/762,063

(22) Filed: Jul. 2, 2024

(65) Prior Publication Data

US 2025/0014845 A1 Jan. 9, 2025

(30) Foreign Application Priority Data

Jul. 3, 2023 (JP) ................................ 2023-108981

(51) Int. Cl.
*H01H 13/14* (2006.01)
*G04G 21/08* (2010.01)
*H05K 7/14* (2006.01)

(52) U.S. Cl.
CPC ............ *H01H 13/14* (2013.01); *G04G 21/08* (2013.01); *H05K 7/1427* (2013.01)

(58) Field of Classification Search
CPC ...... H01H 13/14; H01H 3/125; H01H 13/705; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; G04G 21/08; G04G 17/04; G04G 17/02; G04G 17/00; H05K 7/1427; G04C 3/001; G04B 3/048
See application file for complete search history.

(56) References Cited

U.S. PATENT DOCUMENTS

| | | | | |
|---|---|---|---|---|
| 2,374,873 A * | 5/1945 | Mcdonald, Jr. | ........ | H01H 13/14 200/16 R |
| 2009/0090607 A1 * | 4/2009 | Ichikawa | ............ | H01H 13/704 200/341 |
| 2020/0243278 A1 * | 7/2020 | Furuta | .................... | H01H 13/64 |
| 2024/0322824 A1 * | 9/2024 | Nakae | ....................... | G06F 3/02 |

FOREIGN PATENT DOCUMENTS

| | | |
|---|---|---|
| JP | 2004333325 A | 11/2004 |
| JP | 2020098177 A1 | 6/2020 |

* cited by examiner

*Primary Examiner* — Ahmed M Saeed
(74) *Attorney, Agent, or Firm* — Scully, Scott, Murphy & Presser, P.C.

(57) ABSTRACT

Disclosed is an electronic device, including: a case; a ground conductor plate that is accommodated in the case; a push button that penetrates the case from an outer surface of the case through to an inner surface of the case, and is slidable in a direction of penetration; a fixed contact that is fastened to the ground conductor plate inside the case and is disposed in front of the push button; an electrical insulator that is interposed between the ground conductor plate and the fixed contact and electrically insulates the fixed contact from the ground conductor plate; and a movable contact that is electrically connected to the ground conductor plate, and is pushed against the fixed contact by the push button being pushed toward inside the case.

11 Claims, 9 Drawing Sheets

ELECTRONIC DEVICE

REFERENCE TO RELATED APPLICATIONS

This application is based upon and claims the benefit of priority from the prior Japanese Patent Application No. 2023-108981, filed on Jul. 3, 2023, the entire contents of which are incorporated herein by reference.

TECHNICAL FIELD

The present disclosure pertains to an electronic device.

DESCRIPTION OF RELATED ART

In order to improve the impact resistance and abrasion resistance of an electronic device such as a timepiece, a metallic plate is housed inside a case for the electronic device. For example, JP 2004-333325A discloses a technique by which a rotor and a wheel train driver for a timepiece are attached to a plate and the plate is metallic, whereby abrasion of the plate by the rotor and the wheel train driver is suppressed.

In contrast, push switches are typically employed in electronic devices such as a timepiece, as with a technique disclosed in JP 2020-98177A. A push switch normally has a push button, a movable contact, and a fixed contact. When a user pushes the push button, the movable contact is pushing against the fixed contact by the push button. When the user stops pushing the push button, the push button returns to the original position thereof due to an elastic force from a spring or the like, and the movable contact separates from the fixed contact.

SUMMARY OF THE INVENTION

An electronic device according to an aspect of the present disclosure is an electronic device, including: a case; a ground conductor plate that is accommodated in the case; a push button that penetrates the case from an outer surface of the case through to an inner surface of the case, and is slidable in a direction of penetration; a fixed contact that is fastened to the ground conductor plate inside the case and is disposed in front of the push button; an electrical insulator that is interposed between the ground conductor plate and the fixed contact and electrically insulates the fixed contact from the ground conductor plate; and a movable contact that is electrically connected to the ground conductor plate, and is pushed against the fixed contact by the push button being pushed toward inside the case.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION

Figure 1:
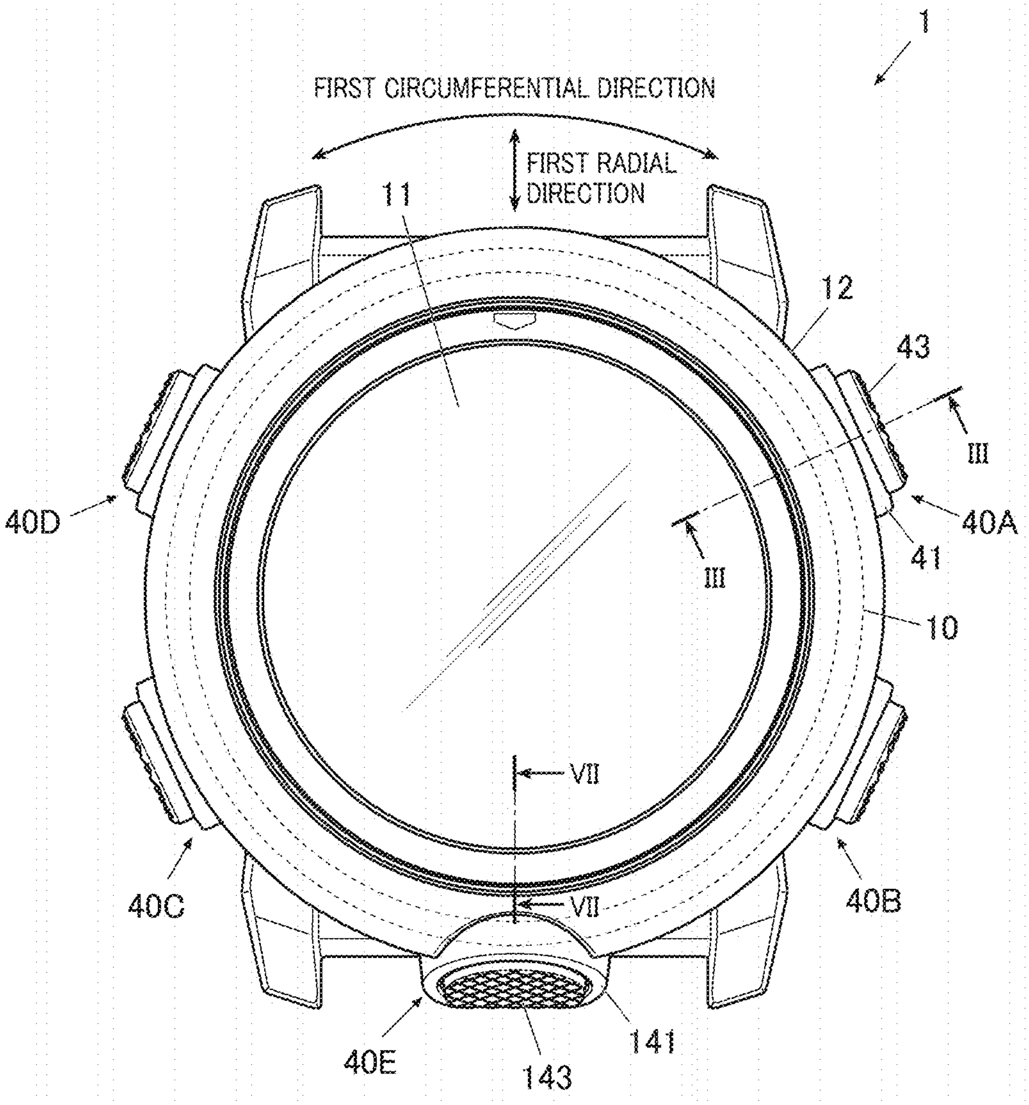
FIG. 1 is a plan view of an electronic device.

Embodiments are described below with reference to the drawings. Features and technical effects of the embodiments will be understood from the following detailed description and the drawings. However, the scope of the present disclosure is not limited to the embodiments described below. The drawings are provided only for the purpose of exemplification, and thus the scope of the present disclosure is not limited to the exemplification in the drawings.

In a case where an ordinal number such as "first" or "second" is added to a common name in the following description, the ordinal number is used only for the objective of identifying a target to which the ordinal number has been added. A target to which an ordinal number has been added is not limited to a specific target, and the ordinal number does not specify an order, rank, sequence, class, priority, subordination, or the like for the target to which the ordinal number has been added.

1. Outline of Electronic Device

FIG. 1 is a plan view of the front of an electronic device 1. The electronic device 1 is a timepiece that indicate the time. The electronic device 1 is mounted to the arm of a user by an arm band or an arm belt.

The electronic device 1 has a case 10, a windshield 11, an exterior material 12, a timepiece module, a dial, a back cover, and push switches 40A through 40E.

The case 10 is shaped into a thin frame. In other words, the case 10 is shaped into a cylinder that has a short size in the axial direction thereof. The axial direction referred to here means the direction from the front of the electronic device 1 to the back thereof, or the reverse direction thereto. In other words, the axial direction is orthogonal to the paper surface of FIG. 1. The axial direction, circumferential direction, and radial direction that pertain to the case 10 are respectively referred to below as a first axial direction, a first circumferential direction, and a first radial direction.

The case 10 has therein a hollow 10*b* (refer to FIG. 3 and FIG. 4) that is surrounded by the case 10. The windshield 11, which is transparent, is fixed to the front of the case 10 in a manner that covers the hollow 10*b* in the case 10. The exterior material 12 surrounds the circumference of the windshield 11, and is fixed to the case 10. The dial and the timepiece module are accommodated in the hollow 10*b* in the case 10. The dial is stacked on the timepiece module, and faces the windshield 11 inside the hollow 10*b* in the case 10. The back cover is removably attached to the back of the case 10 in a manner that covers the hollow 10*b* in the case 10.

The push switches 40A through 40E are arranged in the first circumferential direction. Representing the positions of the push switches 40A through 40E by clock positions, the push switch 40A is disposed at the 2 o'clock position, the push switch 40B is disposed at the 4 o'clock position, the push switch 40C is disposed at the 8 o'clock position, the push switch 40D is disposed at the 10 o'clock position, and the push switch 40E is disposed at the 6 o'clock position. The push switches 40A through 40E are normally open type switches. The push switches 40A through 40E are described in detail below.

The timepiece module displays the time. The timepiece module may display various items of information in addition to the time. The timepiece module may be an analog timepiece module that uses hands to display the time. The timepiece module may be a digital timepiece module that uses numbers to display the time. The timepiece module may be an analog and digital timepiece module that uses hands and numbers to display the time. In a case where the timepiece module is an analog timepiece module or an analog and digital timepiece module, the timepiece module has a wheel train mechanism for causing the hands to operate. A power source for the wheel train mechanism is a mainspring mechanism or a motor. In a case where the timepiece module is a digital timepiece module or an analog and digital timepiece module, the timepiece module has a liquid-crystal display device.

2. Main Plate, Main Circuit Board, and Sub Circuit Board

Figure 2:
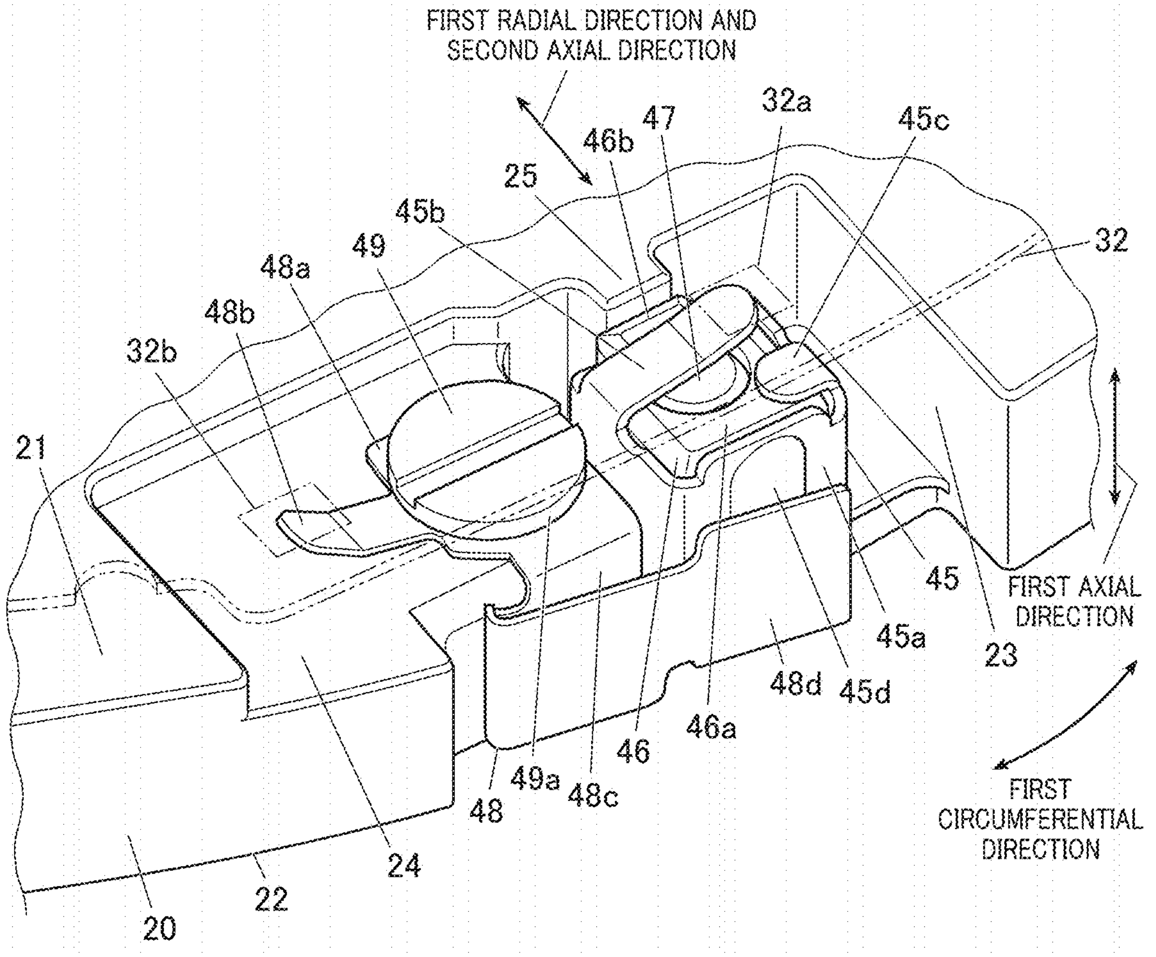
FIG. 2 is a perspective view that illustrates a main plate that is inside the electronic device.
Figure 3:
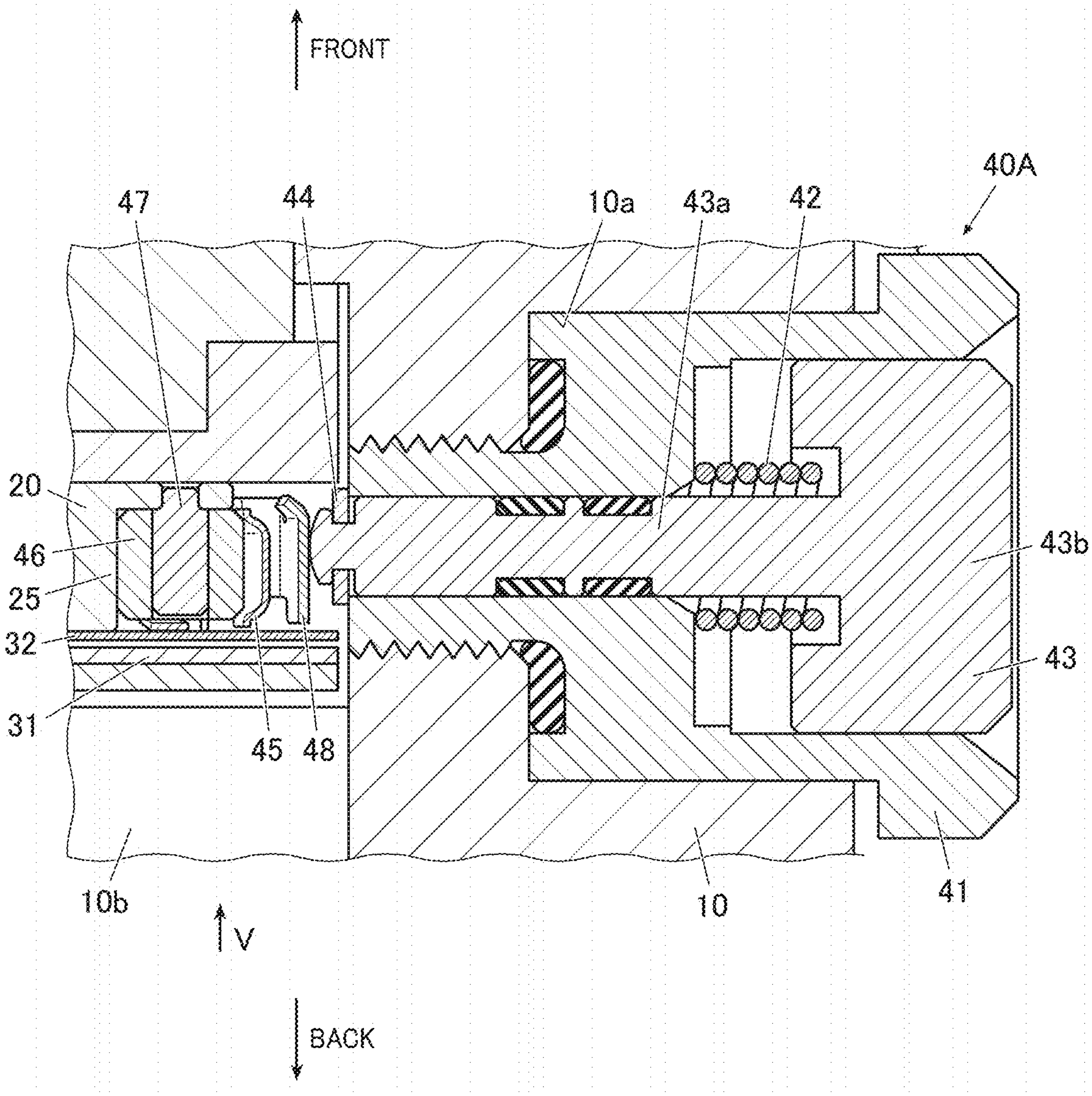
FIG. 3 is a cross-sectional view that illustrates a cross-section along a line III-III that is illustrated in FIG. 1.

FIG. 2 is a perspective view in which a main plate 20 of the timepiece module inside the case 10 is illustrated, viewed from the back thereof. FIG. 3 is a cross-sectional view that illustrates a cross-section along a line III-III that is illustrated in FIG. 1.

The timepiece module has the main plate 20, a main circuit board 31, and a sub circuit board 32. The main plate 20, the main circuit board 31, and the sub circuit board 32 are disposed within the hollow 10*b* in the case 10, and are between the dial and the back cover. The main circuit board 31, the sub circuit board 32, and the main plate 20 are disposed in this order from the back cover toward the windshield 11. In other words, the sub circuit board 32 is overlapped on the main circuit board 31, and the main plate 20 is overlapped on the sub circuit board 32. The sub circuit board 32 and the main circuit board 31 may be in contact, or may be separate. Another member may or may not be present between the sub circuit board 32 and the main circuit board 31. The main plate 20 and the sub circuit board 32 may be in contact or may be separate. Another member may or may not be present between the main plate 20 and the sub circuit board 32. Wiring formed in the sub circuit board 32 is electrically insulated from the main plate 20 by insulation coating formed on the surface of the sub circuit board 32.

The basic shape of the main plate 20 is a circle. The main plate 20 has pins, protrusions, depressions, holes, notches, grooves, internal thread, or the like for each component of the timepiece module to be attached to, mounted to, fixed to, supported by, held by, or disposed on the main plate 20. The main plate 20 is made from a metal material, and thus the main plate 20 is electrically conductive. The main plate 20 is a ground that defines a reference for the potential of various components in an electric circuit, and the potential of the main plate 20 is 0 V. Accordingly, the main plate 20 may be referred to as a ground conductor plate. Note that the main plate 20 is electrically connected to the back cover, and the back cover may be made from a metal material.

The main plate 20 has a thickness that goes from a back surface 21 of the main plate 20 to a front surface 22 of the main plate 20. The back surface 21 faces the back cover, and the front surface 22 faces the windshield 11.

The main plate 20 has a first recess 23 and a second recess 24 that are recessed from the back surface 21. The first recess 23 and the second recess 24 reach an outer edge of the back surface 21, and the first recess 23 and the second recess 24 are open at the outer circumferential surface of the main plate 20. The first recess 23 and the second recess 24 are lined up along the outer circumference of the main plate 20. The second recess 24 and the first recess 23 are integral. The first recess 23 is deeper than the second recess 24. The bottom and inner surfaces of the first recess 23 may be subjected to an insulation coating.

The main plate 20 has a protrusion 25 within the first recess 23. The protrusion 25 is formed on the inner surface of the first recess 23 that follows the outer circumferential surface of the main plate 20. The protrusion 25 is on an extension line from a through hole 10*a*, which is described below. The protrusion 25 projects from the inner surface of the first recess 23 toward the inner circumferential surface of the case 10 and the later-described through hole 10*a*.

The sub circuit board 32 covers the first recess 23 and the second recess 24. The sub circuit board 32 has terminal pads 32*a* and 32*b* on the surface thereof that faces the main plate 20. The terminal pad 32*a* is positioned over the first recess 23, and the terminal pad 32*b* is positioned over the second recess 24.

Representing the positions of the first recess 23 and the second recess 24 by clock positions, the first recess 23 and the second recess 24 are disposed at the 2 o'clock position. The first recess 23 and the second recess 24 are provided for the push switch 40A. Recesses similar to the first recess 23 and the second recess 24 are respectively formed in the back surface 21 of the main plate 20, at 4 o'clock, 8 o'clock, 10 o'clock, and 6 o'clock positions for the push switches 40B, 40C, 40D, and 40E.

3. Push Switch

Figure 4:
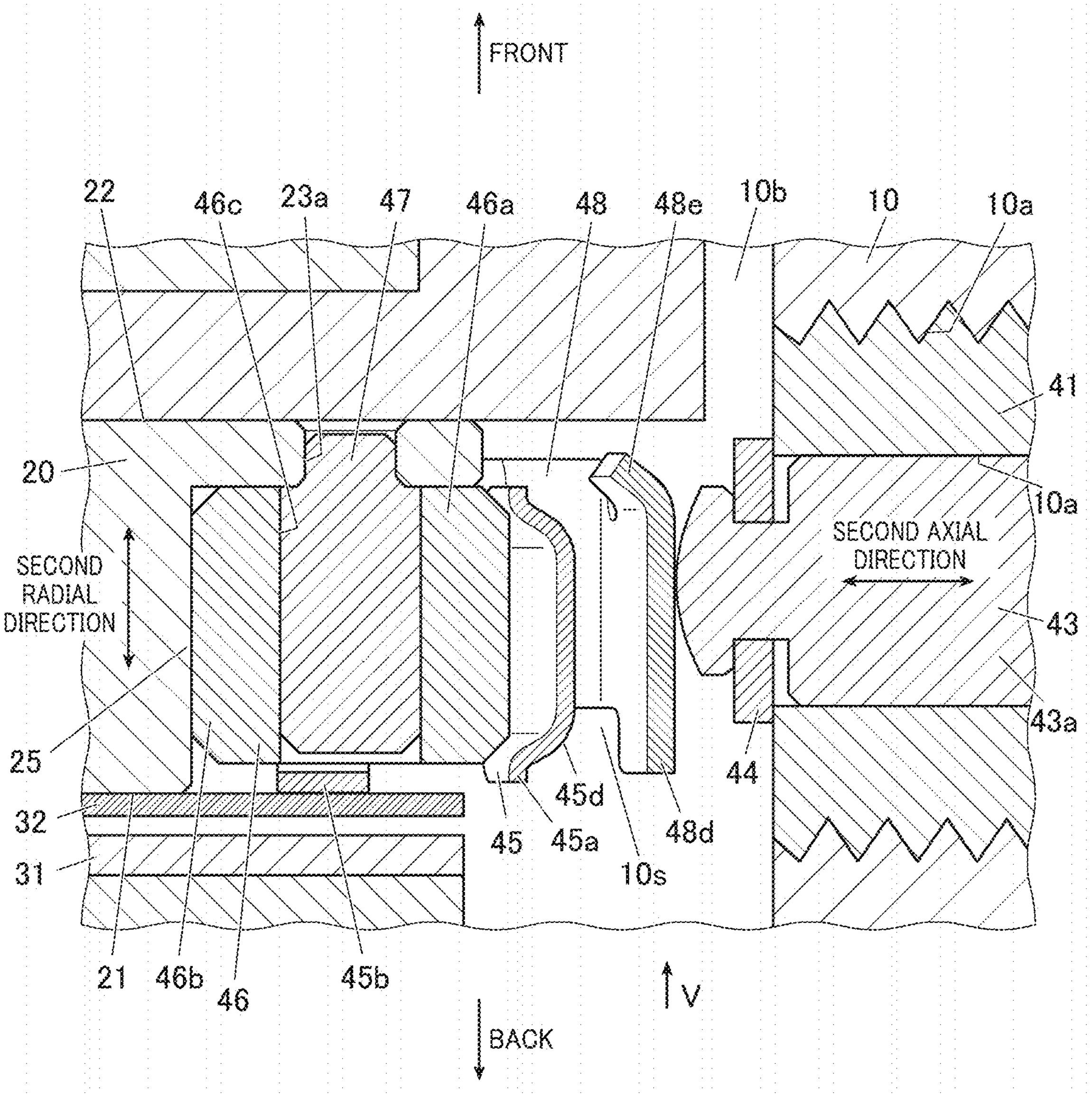
FIG. 4 is an enlarged view of a partial region in FIG. 3.
Figure 5:
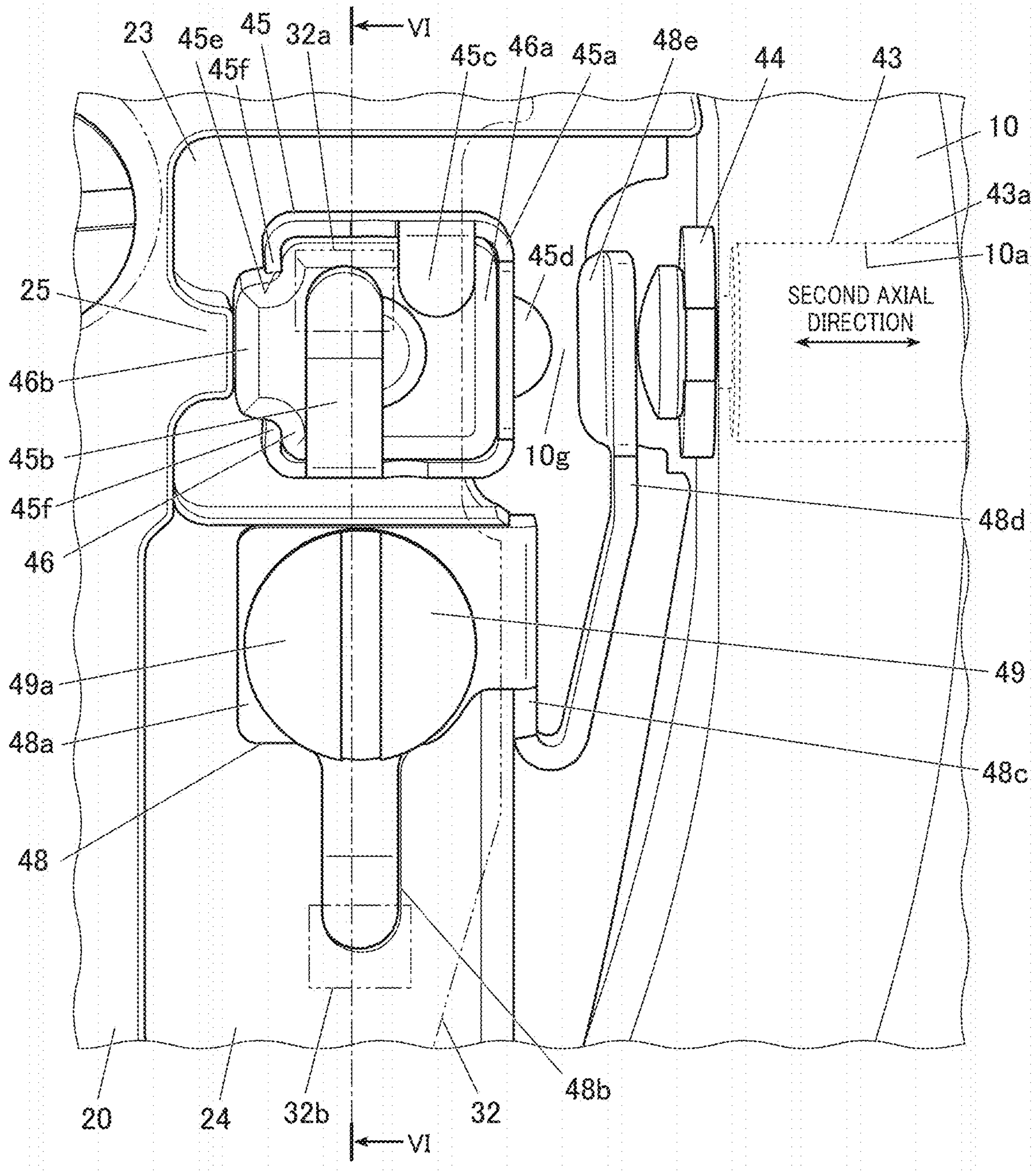
FIG. 5 is a plan view in which the main plate is illustrated, seen from the back thereof, as with a line-of-sight direction for an arrow V that is illustrated in FIG. 3 and FIG. 4.
Figure 6:
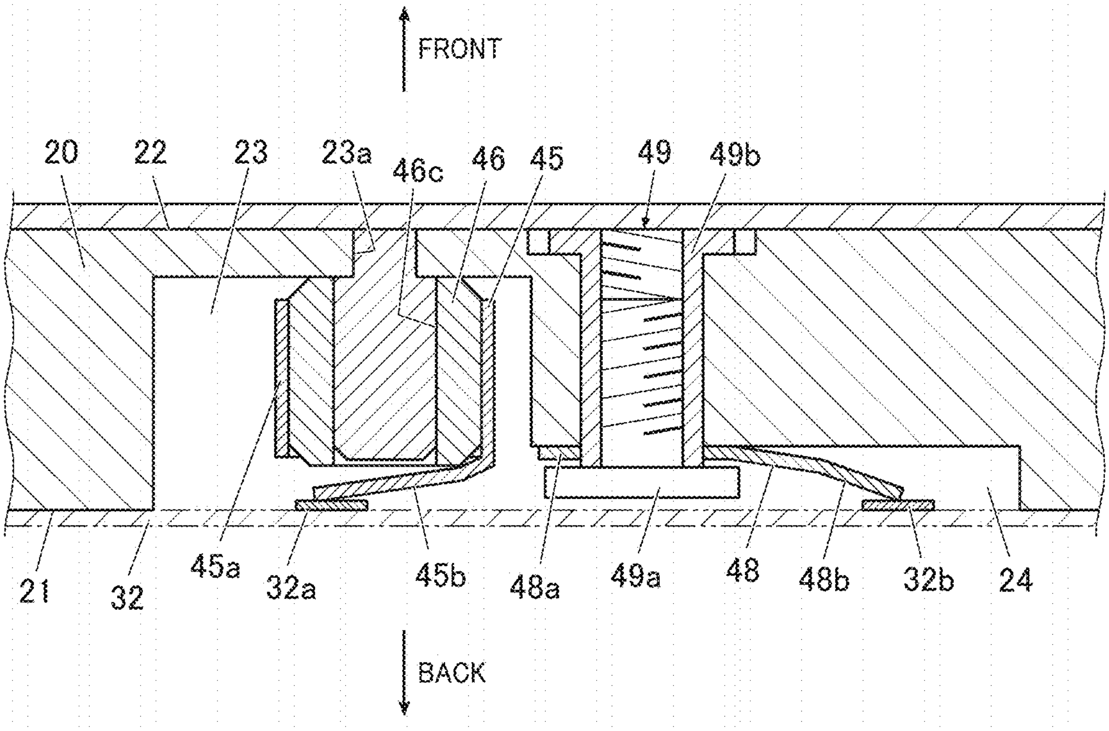
FIG. 6 is a cross-sectional view that illustrates a cross-section along a line VI-VI that is illustrated in FIG. 5.

FIG. 4 is an enlarged view of a partial region in FIG. 3. FIG. 5 is a plan view in which the main plate 20 is illustrated, seen from the back of the electronic device 1, as with a line-of-sight direction for an arrow V in FIG. 3 and FIG. 4. FIG. 6 is a cross-sectional view that illustrates a cross-section along a line VI-VI that is illustrated in FIG. 5.

As illustrated in FIG. 2 through FIG. 6, the push switch 40A is provided with a cylinder 41, a coil spring 42, a push button 43, a retaining ring 44, a fixed contact 45, an electrical insulator 46, a fastening pin 47, a movable contact 48, and a fastener 49.

The cylinder 41, the push button 43, the coil spring 42, and the retaining ring 44 are supported by the case 10. The fixed contact 45, the electrical insulator 46, the fastening pin 47, the movable contact 48, and the fastener 49 are supported by the main plate 20 inside the hollow 10*b* in the case 10.

(1) Cylinder

As illustrated in FIG. 3 and FIG. 4, the cylinder 41 has a hollow therein. The cylinder 41 is provided in a cylindrical shape such that this hollow is surrounded. The hollow in the cylinder 41 opens at both ends of the cylinder 41 in the axial direction of the cylinder 41. The diameter of a portion of the hollow in the cylinder 41 that is near one end thereof is larger than the diameter of a portion near the other end thereof. Hereinafter, the portion having the larger diameter is referred to as a large-diameter portion, and the portion having the smaller diameter is referred to as a small-diameter portion.

The cylinder 41 is fixed to a side surface of the case 10. Specifically, the case 10 has, on the side surface of the case 10, the through hole 10*a* that penetrates from the inner circumferential surface of the case 10 through to the outer circumferential surface of the case 10 in the first radial direction. The cylinder 41 is fitted into the through hole 10*a*. External thread on the outer circumferential surface of the cylinder 41 is screwed onto internal thread on the inner circumferential surface of the through hole 10*a*. Regarding the orientation of the cylinder 41 when the cylinder 41 is fixed to the case 10, the axial direction of the cylinder 41 is parallel to the first radial direction. The positions of the cylinder 41 and the through hole 10*a* in the first circumferential direction align with the position of the first recess 23 in the first circumferential direction.

(2) Coil Spring

As illustrated in FIG. 3, the coil spring 42 is accommodated in the large-diameter portion of the hollow in the cylinder 41.

(3) Push Button

As illustrated in FIG. 3 through FIG. 5, the push button 43 is inserted into the cylinder 41, and the push button 43 is coaxial with the cylinder 41. An axial direction, circumferential direction, and radial direction that pertain to the push button 43 and the cylinder 41 are respectively referred to below as a second axial direction, a second circumferential direction, and a second radial direction. The second axial direction is parallel to the first radial direction. The second axial direction is the penetration direction in which the push button 43 penetrates from the outer circumferential surface of the case 10 to the inner circumferential surface thereof.

A radial load from the push button 43 is received by the cylinder 41, and the push button 43 is guided in the second axial direction by the cylinder 41. The push button 43 can slide with respect to the cylinder 41 in the second axial direction and the first radial direction. The coil spring 42 is sandwiched between the push button 43 and the cylinder 41 in the second axial direction. When the push button 43 is pushed toward the hollow 10*b* in the case 10, the coil spring 42 is compressed. When pushing of the push button 43 is released, the push button 43 is biased toward outside the case 10 by the elastic force of the coil spring 42, and the push button 43 returns to the original position thereof.

The push button 43 has a shaft 43*a* and a head 43*b*. The shaft 43*a* extends in the second axial direction. The head 43*b* is provided, integrally with the shaft 43*a*, at an end of the shaft 43*a* in the second axial direction. The diameter of the head 43*b* is larger than the diameter of the shaft 43*a*. The shaft 43*a* is inserted into the small-diameter portion of the hollow in the cylinder 41, and the head 43*b* is inserted into the large-diameter portion. The head 43*b* may slightly protrude outside the case 10 from the hollow in the cylinder 41. The tip of the shaft 43*a* slightly protrudes into the hollow 10*b* in the case 10 from the hollow in the cylinder 41. In the large-diameter portion of the cylinder 41, the coil spring 42 is sandwiched between the head 43*b* and a step surface of the cylinder 41. The step surface of the cylinder 41 refers to a ring-shaped surface that connects the inner circumferential surface of the small-diameter portion with the inner circumferential surface of the large-diameter portion, and also extends in the second radial direction and the second circumferential direction.

(4) Retaining Ring

As illustrated in FIG. 3 through FIG. 5, the retaining ring 44 is attached to the tip of the push button 43, in other words the tip of the shaft 43*a*, in the hollow 10*b* in the case 10. The retaining ring 44 is hooked onto an end of the cylinder 41. Such hooking contributes to stopping the push button 43 from coming out of the cylinder 41.

(5) Fixed Contact, Electrical Insulator, and Fastening Pin

As illustrated in FIG. 2, FIG. 5, and FIG. 6, the fixed contact 45, the electrical insulator 46, and the fastening pin 47 are disposed in the first recess 23. The fixed contact 45, the electrical insulator 46, and the fastening pin 47 are disposed in front of the tip of the push button 43.

The electrical insulator 46 is fastened to the bottom of the first recess 23 in the main plate 20 by the fastening pin 47. The fixed contact 45 confines the electrical insulator 46 and is supported by the electrical insulator 46, whereby the fixed contact 45 is separated from the main plate 20 and the fixed contact 45 is electrically insulated from the main plate 20. The fixed contact 45 is in contact with the terminal pad 32*a* on the sub circuit board 32, and an electrical connection is achieved between the fixed contact 45 and the terminal pad 32*a*. Note that, in FIG. 6, the thicknesses of the terminal pads 32*a* and 32*b* are exaggerated.

The electrical insulator 46 is a block as illustrated in FIG. 2, and is formed from a ceramic such as zirconia, for example. The electrical insulator 46, which is made of a ceramic, has a high impact resistance and a high load bearing capacity. Note that the material of the electrical insulator 46 does not have to be a ceramic. The electrical insulator 46 may be formed from a synthetic resin, such as a polyacetal, a polycarbonate, a polyamide, or an ABS resin, for example.

As illustrated in FIG. 2 and FIG. 4 through FIG. 6, the electrical insulator 46 has a body 46*a*, a protrusion 46*b*, and a through hole 46*c*.

The body 46*a* is a block that has a cubic or a rectangular parallelepiped shape. The corners of the body 46*a* are chamfered. The chamfering may be C-chamfering or round chamfering. The chamfering contributes to preventing damage to the electrical insulator 46.

The through hole 46*c* is formed in the body 46*a* so as to penetrate through two facing surfaces of the body 46*a*. When the electrical insulator 46 is disposed in the first recess 23, the front surface from among the facing surfaces of the body 46*a* faces the bottom of the first recess 23, and the back surface faces the sub circuit board 32. The protrusion 46*b* is provided as a protruding shape on a side surface of the body 46*a* that is not a facing surface thereof.

The fastening pin 47 is fitted into the through hole 46*c* while having a slight amount of play with respect to the inner surfaces of the through hole 46*c* in the electrical insulator 46. The tip of the fastening pin 47 protrudes from the through hole 46*c*, and the tip is fitted into a fastening hole 23*a* that is formed in the bottom of the first recess 23. As a result, the fastening pin 47 is fastened to the bottom of the first recess 23, movement by the electrical insulator 46 in a direction that goes straight through the central axis of the fastening pin 47 is restrained by the fastening pin 47, and the electrical insulator 46 is fastened to the bottom of the first recess 23. The fastening pin 47 may be adhered to the main plate 20 by an adhesive or the like.

The protrusion 46*b* of the electrical insulator 46 projects towards the protrusion 25 on the inner surface of the first recess 23, and is in contact with the protrusion 25.

The fastening pin 47 is made of metal, a ceramic, or a resin. If the fastening pin 47 is made of metal or a ceramic, the fastening pin 47 has high strength, and the electrical insulator 46 is strongly fastened to the main plate 20. The material of the fastening pin 47 may be the same as or different to the material of the main plate 20. The material of the fastening pin 47 may be the harder than the material of the main plate 20. In other words, the elastic modulus of the material of the fastening pin 47 may be higher than the elastic modulus of the material of the main plate 20.

The fixed contact 45 is formed from a metal material. The fixed contact 45 may be an object on which a metal coating has been applied using plating. The fixed contact 45 is electrically conductive. The fixed contact 45 has been subjected to bending.

As illustrated in FIG. 2 and FIG. 5, the fixed contact 45 has a frame 45*a*, a first hook 45*b*, a second hook 45*c*, and a protuberance 45*d*. The frame 45*a*, the first hook 45*b*, the second hook 45*c*, and the protuberance 45*d* are integrally formed. The frame 45*a*, the first hook 45*b*, the second hook 45*c*, and the protuberance 45*d* are electrically conductive.

The frame 45*a* surrounds the side surfaces of the body 46*a* of the electrical insulator 46 to thereby hug the body 46*a*. The frame 45*a* is separated from the inner surface of the first recess 23. Chamfering of the corners of the electrical insulator 46 contributes to facilitating the body 46*a* of the electrical insulator 46 fitting inside the frame 45*a*.

The frame 45*a* has a slit 45*e* that goes from the inside of the frame 45*a* through to the outside of the frame 45*a*. The surrounding by the frame 45*a* is discontinuous at the slit 45*e*. The slit 45*e* is disposed at a position that faces the protrusion 25 formed in the first recess 23. The frame 45*a* has a pair of claws 45*f* on both sides of the slit 45*e*. The claws 45*f* project toward the center of the slit 45*e*. The body 46*a* of the electrical insulator 46 is fitted inside the frame 45*a*, and the protrusion 46*b* of the electrical insulator 46 projects outside of the frame 45*a* through the slit 45*e*. The protrusion 46*b* is in contact with the protrusion 25. The protrusion 46*b* is sandwiched between the pair of claws 45*f*. The claws 45*f* hook onto side surfaces of the body 46*a*.

The first hook 45*b* extends from an edge of the frame 45*a* that is close to the sub circuit board 32, and is bent toward inside the frame 45*a*. The first hook 45*b* partially covers a region that is surrounded by the frame 45*a*. The first hook 45*b* hooks onto the back surface from among the facing surfaces of the body 46*a* of the electrical insulator 46. Hooking by the first hook 45*b* contributes to supporting the frame 45*a* of the fixed contact 45 by the body 46*a*. Therefore, the frame 45*a* is separated from the bottom of the first recess 23. The first hook 45*b* is in contact with the terminal pad 32*a* of the sub circuit board 32. In order for the tip of the first hook 45*b* to reliably come into contact with the terminal pad 32*a*, the first hook 45*b* may be arched toward the terminal pad 32*a*. The potential of the fixed contact 45 is determined by the terminal pad 32*a*. The potential of the fixed contact 45 is higher than the potential of the main plate 20.

On the side opposite the first hook 45*b* in relation to the center of the region that is surrounded by the frame 45*a*, the second hook 45*c* extends from an edge of the frame 45*a* that is close to the sub circuit board 32, and is bent toward the inside of the frame 45*a*. The second hook 45*c* partially covers the region that is surrounded by the frame 45*a*. The second hook 45*c* hooks onto the back surface of the body 46*a*. Hooking by the second hook 45*c* contributes to supporting the frame 45*a* of the fixed contact 45 by the body 46*a*. Therefore, the frame 45*a* is separated from the bottom of the first recess 23. In particular, employing the second hook 45*c* in addition to the first hook 45*b* contributes to stably supporting the frame 45*a* by the body 46*a*.

In a case where the fastening pin 47 is electrically conductive, the first hook 45*b* and the second hook 45*c* are separated from the fastening pin 47. If the fastening pin 47 is drawn into the through hole 46*c*, the first hook 45*b* and the second hook 45*c* are reliably insulated from the fastening pin 47.

The protuberance 45*d* is formed into a protruding shape on the frame 45*a*, on the side opposite the slit 45*e* in relation to the center of the region that is surrounded by the frame 45*a*. The protuberance 45*d* projects from the frame 45*a* toward the through hole 10*a*.

A portion of the fixed contact 45 that faces the bottom of the first recess 23 may be subjected to an insulation coating. A portion of the fixed contact 45 that faces the inner surfaces of the first recess 23 may be subjected to an insulation coating.

(6) Movable Contact and Fastener

As illustrated in FIG. 2 and FIG. 5, the movable contact 48 is disposed in the second recess 24. The movable contact 48 is fixed to the bottom of the second recess 24 by the fastener 49. The movable contact 48 is in contact with the main plate 20, and an electrical connection is achieved between the movable contact 48 and the main plate 20. The potential of the movable contact 48 is 0V. The movable contact 48 is in contact with the terminal pad 32*b* belonging to the sub circuit board 32, and an electrical connection is achieved between the movable contact 48 and the terminal pad 32*b*. The movable contact 48 juts out from the outer edge of the back surface 21 of the main plate 20, in particular juts out from the edge of the bottom of the second recess 24, and is bent toward the outer circumferential surface of the main plate 20. The movable contact 48 is also folded back into the space between the fixed contact 45 and the tip of the push button 43. When the push button 43 is pushed, the movable contact 48 is pushed by the tip of the push button 43 toward the fixed contact 45. As a result, the movable contact 48 elastically deforms, and the movable contact 48 comes into contact with the fixed contact 45. When pushing of the push button 43 is released, the movable contact 48 is restored, and the movable contact 48 separates from the fixed contact 45.

The movable contact 48 is formed from a metal material. The movable contact 48 may be an object on which a metal coating has been applied using plating. The movable contact 48 is electrically conductive. The movable contact 48 has been subjected to bending.

The movable contact 48 has a base 48*a*, a terminal 48*b*, a side support 48*c*, a leaf spring 48*d*, and a diagonal flange 48*e*. The base 48*a*, the terminal 48*b*, the side support 48*c*, the leaf spring 48*d*, and the diagonal flange 48*e* are integrally formed. The base 48*a*, the terminal 48*b*, the side support 48*c*, and the leaf spring 48*d* are electrically conductive.

The base 48*a* is formed into a rectangular shape. The base 48*a* has a through hole in the center thereof. The base 48*a* is laid down on the bottom of the second recess 24, and is close to the first recess 23. The fastener 49 is inserted into the through hole in the base 48*a*, and the fastener 49 is used to fasten the base 48*a* to the main plate 20. The base 48*a* is in contact with the main plate 20, and an electrical connection is achieved between the base 48*a* and the main plate 20.

The terminal 48*b* includes a strip. The terminal 48*b* extends in the first circumferential direction from an end of the base 48*a* in the first circumferential direction. The terminal 48*b* is in contact with the terminal pad 32*b* of the sub circuit board 32. In order for the tip of the terminal 48*b* to reliably come into contact with the terminal pad 32*b*, the terminal 48*b* may be arched toward the terminal pad 32*b*.

The side support 48*c* is, at an end of the base 48*a*, bent toward the outer circumferential surface of the main plate 20. The side support 48*c* extends from the end of the base 48*a* toward the front surface 22 of the main plate 20. The side support 48*c* faces a portion of the outer circumferential surface of the main plate 20. The side support 48*c* may be in contact with the outer circumferential surface of the main plate 20.

The leaf spring 48*d* is folded over the side support 48*c* from an end of the side support 48*c* in the first circumferential direction. The leaf spring 48*d* is, from the end of the side support 48*c* in the first circumferential direction, folded back toward the space between the protuberance 45*d* on the fixed contact 45 and the tip of the shaft 43*a* of the push button 43. The angle at which the leaf spring 48*d* is bent with respect to the side support 48*c* exceeds 90 degrees and is less than 180 degrees. The leaf spring 48*d* extends from the folded-back portion thereof along the outer circumference of the main plate 20, and is inserted between the protuberance 45*d* on the fixed contact 45 and the tip of the shaft 43*a* of the push button 43. When the leaf spring 48*d* is in the natural state thereof, the leaf spring 48*d* is separated from the protuberance 45*d*. When the leaf spring 48*d* is in the natural state thereof, the leaf spring 48*d* may be in contact with or separated from the tip of the shaft 43*a*. When the leaf spring 48*d* is in the natural state thereof, the leaf spring 48*d* may be orthogonal with respect to the central axis of the shaft 43*a* of the push button 43. Note that the leaf spring 48*d* has a width of a dimension that is long in the thickness direction of the main plate 20, in other words along the first axial direction.

When the push button 43 is pushed, the leaf spring 48*d* is pushed by the tip of the shaft 43*a* toward the protuberance 45*d*. As a result, the leaf spring 48*d* elastically deforms, and the leaf spring 48*d* comes into contact with the protuberance 45*d*. Contact between the leaf spring 48*d* and the protuberance 45*d* causes the push switch 40A to turn on. When pushing of the push button 43 is released, the leaf spring 48*d* restores, and the leaf spring 48*d* separates from the protuberance 45*d*. The leaf spring 48*d* is folded back from the end of the side support 48*c*. Therefore, restoration by the leaf spring 48*d* is facilitated, and the leaf spring 48*d* reliably separates from the protuberance 45*d*. The leaf spring 48*d* separating from the protuberance 45*d* causes the push switch 40A to turn off.

The diagonal flange 48*e* extends from an edge of the leaf spring 48*d* toward the windshield 11. The diagonal flange 48*e* is bent from the edge of the leaf spring 48*d* toward the fixed contact 45. The diagonal flange 48*e* inclines toward the fixed contact 45 from a plane that follows the leaf spring 48*d*. In circumstances in which the movable contact 48 is installed on the main plate 20, when the diagonal flange 48*e* comes into contact with the tip of the shaft 43*a*, the diagonal flange 48*e* and the leaf spring 48*d* are guided by the diagonal flange 48*e* into the space between the protuberance 45*d* and the tip of the shaft 43*a*. The inclination of the diagonal flange 48*e* contributes to easily inserting the leaf spring 48*d* and the diagonal flange 48*e* into the space between the protuberance 45*d* and the tip of the shaft 43*a* when the movable contact 48 is installed.

The fastener 49 has a screw 49*a* and a nut 49*b* that has a flange. The nut 49*b* is inserted into a hole that penetrates from the bottom of the second recess 24 to the front surface 22 of the main plate 20, and the flange of the nut 49*b* is hooked on the front surface 22. The shaft of the screw 49*a* is inserted into the through hole in the base 48*a*. The shaft is screwed into the nut 49*b*, and the base 48*a* and the main plate 20 are fastened together by the head of the screw 49*a* and the flange on the nut 49*b*. Note that the fastener 49 may be only a screw or may be a crimping metal fitting or a rivet.

4. Other Push Switches

The push switches 40B through 40D are provided similarly to the push switch 40A. Directions of movement by the push buttons in the push switches 40B through 40D are in the first radial direction, similar to the direction of movement by the push button 43 in the push switch 40A.

Figure 7:
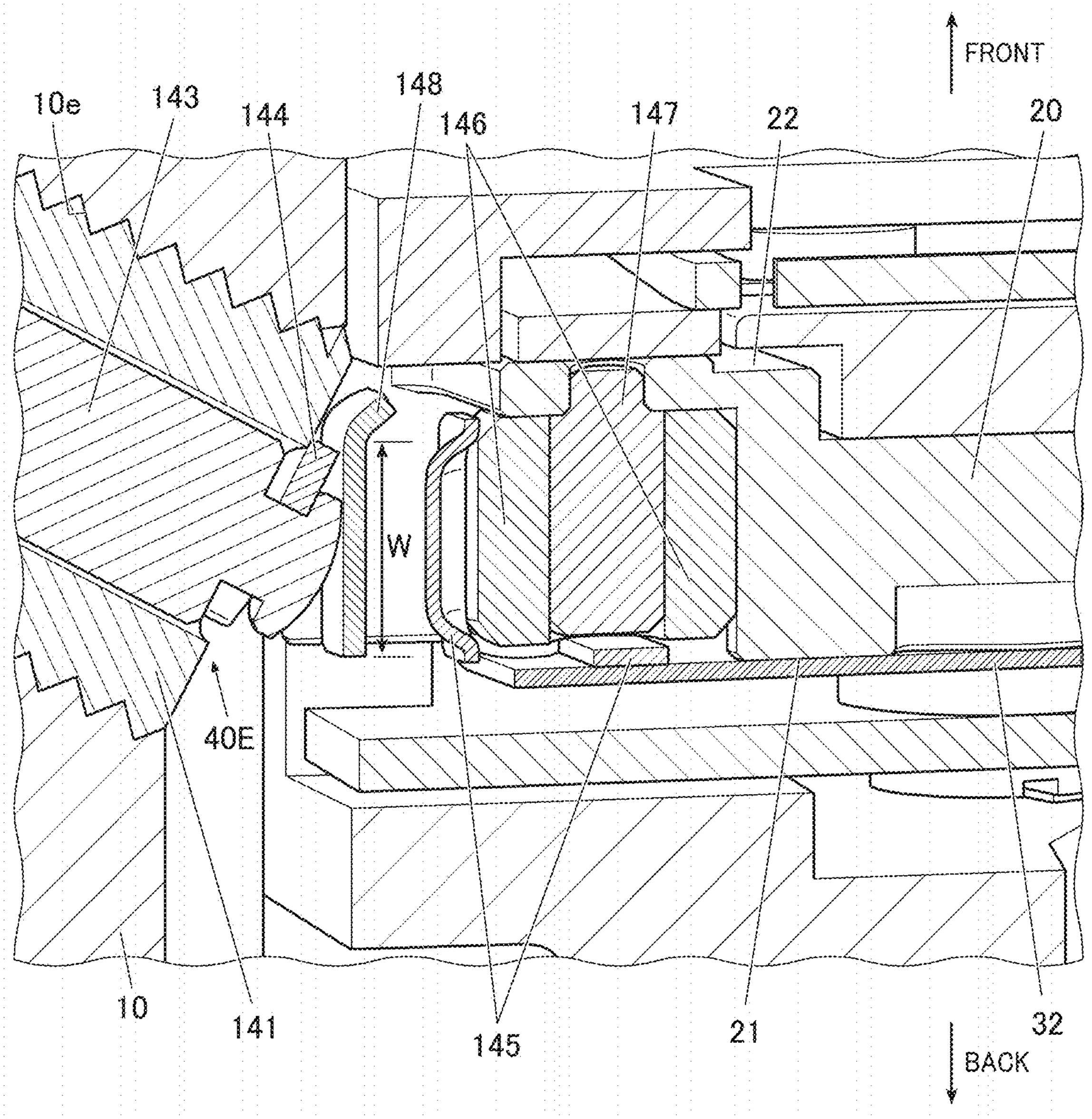
FIG. 7 is a cross-sectional view that illustrates a cross-section along a line VII-VII that is illustrated in FIG. 1.

FIG. 7 is a cross-sectional view that illustrates a cross-section along a line VII-VII that is illustrated in FIG. 1. A cylinder 141 in the push switch 40E corresponds to the cylinder 41 in the push switch 40A. A push button 143 in the push switch 40E corresponds to the push button 43 in the push switch 40A. A retaining ring 144 in the push switch 40E corresponds to the retaining ring 44 in the push switch 40A. A fixed contact 145 in the push switch 40E corresponds to the fixed contact 45 in the push switch 40A. An electrical insulator 146 in the push switch 40E corresponds to the electrical insulator 46 in the push switch 40A. A fastening pin 147 in the push switch 40E corresponds to the fastening pin 47 in the push switch 40A. A movable contact 148 in the push switch 40E corresponds to the movable contact 48 in the push switch 40A. A through hole 10*e* in the case 10 corresponds to the through hole 10*a*.

The push switch 40E is provided similarly to the push switch 40A. However, the direction of movement by the push button 143 in the push switch 40E differs to the direction of movement by the push button 43 in the push switch 40A, and is inclined with respect to the first radial direction.

Similar to the cylinder 41 and the push button 43 of the push switch 40A being mounted to the through hole 10*a* in the case 10, the cylinder 141 and the push button 143 of the push switch 40E are mounted to the through hole 10*e* in the case 10. A central axis for the cylinder 141, the push button 143, and the through hole 10*e* is inclined with respect to the front of the case 10, toward outside in the first radial direction. The inclination of the central axis for the cylinder 141, the push button 143, and the through hole 10*e* contributes to the push button 143 being easy to push for a user.

Because the push switches 40A through 40E are similarly provided, components of the push switches 40A through 40E are standardized.

Figure 9:
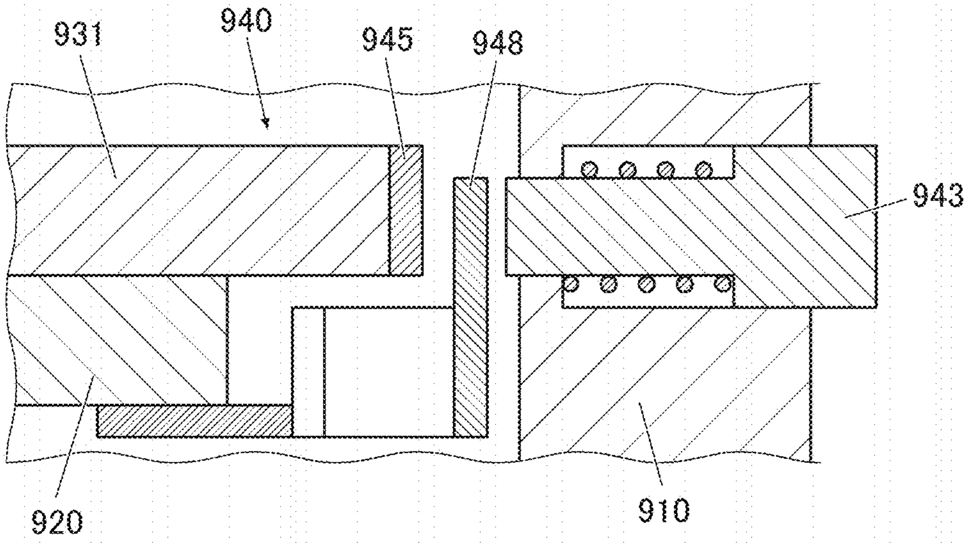
FIG. 9 is a cross-sectional view that illustrates a timepiece according to a comparative example.

5. Summary (1) The electrical insulator 46 is interposed between the main plate 20 and the fixed contact 45, and electrically insulates the fixed contact 45 from the main plate 20. When the fixed contact 45 is attached to the electrically conductive main plate 20, such an electrical insulator 46 contributes to employing both of the push switch 40A and the main plate 20 in the electronic device 1. The fixed contact 45 is attached to the main plate 20. Therefore, a plated pad for a fixed contact does not need to be provided on a side surface of the sub circuit board 32. This contributes to reducing the thickness of the sub circuit board 32 and the cost of manufacturing the sub circuit board 32, and consequently contributes to reducing the thickness of the electronic device 1 and reducing the cost of the electronic device 1. Here, description is given in detail regarding technically advantageous effects of the present embodiment, by comparing the present embodiment with a comparative example. FIG. 9 is a cross-sectional view of a timepiece that is provided with a push switch 940 according to the comparative example. As illustrated in FIG. 9, a circuit board 931 is overlapped with a metallic main plate 920 within a case 910. A movable contact 948 that is formed from a leaf spring is attached to the main plate 920, and an electrical connection is achieved between the movable contact 948 and the main plate 920. When a push button 943 is pushed, the movable contact 948 is pushed by the push button 943 and elastically deforms, and the movable contact 948 comes into contact with a fixed contact 945. A plating treatment or the like is used form the fixed contact 945 on a side surface of the circuit board 931, such that the fixed contact 945 is disposed in front of the tip of the push button 943. In order for the movable contact 948 to reliably come into contact with the fixed contact 945 and also in order to prevent deviation of the position of the fixed contact 945 from arising, the circuit board 931 is thick, and the fixed contact 945 extends over the entire thickness of the circuit board 931. There is a high cost of manufacturing such a circuit board 931. In contrast, in the present embodiment, the electrical insulator 46 contributes to reducing the thickness of the sub circuit board 32 and to reducing the cost of manufacturing the sub circuit board 32. Effects that can be found in the present embodiment are technically very advantageous in comparison to the comparative example.

(2) Because each component of the timepiece module is mounted to the main plate 20, the thickness of the main plate 20 is necessary. Because the first recess 23 is formed in such a main plate 20, the electrical insulator 46, which is thick and block-shaped, is disposed in the first recess 23 and attached to the main plate 20. The fixed contact 45 surrounds such an electrical insulator 46 and is supported by the electrical insulator 46, whereby the fixed contact 45 is separated from the bottom and inner surfaces of the first recess 23, and insulating the fixed contact 45 from the main plate 20 is addressed. Because the first recess 23 reaches the outer circumferential surface of the main plate 20 and is open at this outer circumferential surface, the fixed contact 45 is disposed in front of the tip of the push button 43. Therefore, contact between the movable contact 48 and the fixed contact 45 as well as the separation thereof are realized by the pushing and releasing of the push button 43.

(3) In a case where the position of the push switch 40A is subjected to a design change, it is sufficient for only the positions of the first recess 23 and the second recess 24 to be designed. Accordingly, the push button 43, the retaining ring 44, the fixed contact 45, the electrical insulator 46, the fastening pin 47, the movable contact 48, and the fastener 49 will be employed unchanged, without subjecting the shape or the like of these to a design change.

(4) The frame 45*a* of the fixed contact 45 surrounds the body 46*a* of the electrical insulator 46, and the first hook 45*b* and the second hook 45*c* of the fixed contact 45 extend from the frame 45*a* and are hooked onto the body 46*a*. As a result, the frame 45*a* is supported by the body 46*a*, and the frame 45*a* is separated from the bottom of the first recess 23. Accordingly, insulating the fixed contact 45 from the main plate 20 is addressed. Note that, in the past, both of a push switch and a metallic plate have not been employed in electronic devices. This is because, if, hypothetically, both of a push switch and a metallic plate are employed in an electronic device, the movable contact or the fixed contact for the push switch erroneously short circuits with the metallic plate due to vibration, an impact, or the like. In contrast, in the present embodiment, the hooking of the first hook 45*b* and the second hook 45*c* onto the body 46*a* realizes non-contact between the main plate 20 and the fixed contact 45. This contributes to using both of the metallic main plate 20 and the push switch 40A.

(5) The protrusion 46*b* of the electrical insulator 46 abuts the protrusion 25 on the inner surface of the first recess 23 through the slit 45*e* in the frame 45*a*. When the push button 43 is pushed, a load imparted from the push button 43 to the fixed contact 45 via the movable contact 48 is received by the protrusion 25. In particular, this load is dispersed between the protrusion 25 and the fastening pin 47. Therefore, the electrical insulator 46 and the fixed contact 45 are less likely to deviate.

(6) The direction in which the leaf spring 48*d* of the movable contact 48 comes into contact and separates from the frame 45*a* of the fixed contact 45 is orthogonal to the central axis of the fastening pin 47. Accordingly, when the leaf spring 48*d* of the movable contact 48 is pushed against the frame 45*a* of the fixed contact 45, the electrical insulator 46 is less likely to deviate from the fastening pin 47.

(7) The fastening pin 47 is fitted into the through hole 46*c* while having a slight amount of play with respect to the inner surfaces of the through hole 46*c* in the electrical insulator 46. Accordingly, when the leaf spring 48*d* of the movable contact 48 is vigorously pushed against the frame 45*a* of the fixed contact 45, the force of this impact is absorbed by slight displacement of the electrical insulator 46. Accordingly, the electrical insulator 46 is less likely to deviate from the fastening pin 47.

(8) The direction in which the leaf spring 48*d* of the movable contact 48 comes into contact and separates from the frame 45*a* of the fixed contact 45 is orthogonal to the surface of the frame 45*a* on which the protuberance 45*d* is formed. Accordingly, when the leaf spring 48*d* of the movable contact 48 is pushed against the frame 45*a* of the fixed contact 45, the electrical insulator 46 is less likely to deviate from the fastening pin 47.

(9) When the leaf spring 48*d* is in the natural state thereof, the leaf spring 48*d* may be orthogonal with respect to the central axis of the shaft 43*a* of the push button 43. In this case, a load in an unexpected direction will not occur for the movable contact 48 when the tip of the push button 43 comes into contact with the leaf spring 48*d*. Accordingly, the durability of the movable contact 48 improves.

(10) The leaf spring 48*d* is folded back from the end of the side support 48*c*. Therefore, it is possible to achieve a large stroke for the leaf spring 48*d*, and the movable contact 48 is compact. In addition, restoration by the leaf spring 48*d* is facilitated when pushing is released, and the leaf spring 48*d* reliably separates from the protuberance 45*d*.

(11) In the push switch 40E, the direction in which a leaf spring of the movable contact 148 comes into contact and separates from a frame of the fixed contact 145 is orthogonal to the surface of the frame on which a protuberance is formed. Even if the direction of movement by the push button 143 is diagonal with respect to the leaf spring of the movable contact 148, a load in an unexpected direction does not occur for the fixed contact 145 when the tip of the push button 143 pushes the leaf spring of the movable contact 148 against the frame of the fixed contact 145. Accordingly, the fixed contact 145 and the electrical insulator 146 are less likely to deviate.

(12) The main plate 20 is metallic. Such a main plate 20 is accommodated in the case 10, and the case 10 is reinforced by the main plate 20. Accordingly, the electronic device 1 has robustness.

(13) As illustrated in FIG. 7, the leaf spring of the movable contact 148 in the push switch 40E has a width of dimension w that is long in the thickness direction of the main plate 20, in other words the first axial direction, similarly to the leaf spring 48*d* of the movable contact 48 in the push switch 40A. Accordingly, even if the push button 143 pushes the leaf spring of the movable contact 148 diagonally with respect to a direction orthogonal to the leaf spring, the leaf spring satisfactorily and reliably comes into contact with the fixed contact 145.

6. Variation

In the present embodiment, the electronic device 1 is a timepiece. In contrast, the electronic device 1 may be an electronic device that is not a timepiece, such as a pedometer, a heart rate monitor, an altimeter, or a barometer.

The fixed contact 45 and the electrical insulator 46 may be rectangular strips. In this case, the first recess 23 is not formed, the fixed contact 45 and the electrical insulator 46 are fixed to the outer circumferential surface of the main plate 20 using, inter alia, a fastener that has insulation properties, and the electrical insulator 46 is sandwiched between the fixed contact 45 and the main plate 20, whereby the fixed contact 45 is electrically insulated from the main plate 20. In addition, the fixed contact 45 and the electrical insulator 46 are disposed in front of the tip of the push button 43. When the push button 43 is pushed, the tip of the push button 43 pushes the leaf spring 48*d* of the movable contact 48 against the fixed contact 45. In place of the electrical insulator 46 that is formed from a rectangular strip, it may be that an electrical insulation coating is deposited on the outer circumferential surface of the main plate 20 or the fixed contact 45, and the fixed contact 45 is electrically insulated from the main plate 20 by the electrical insulation coating.

Figure 8:
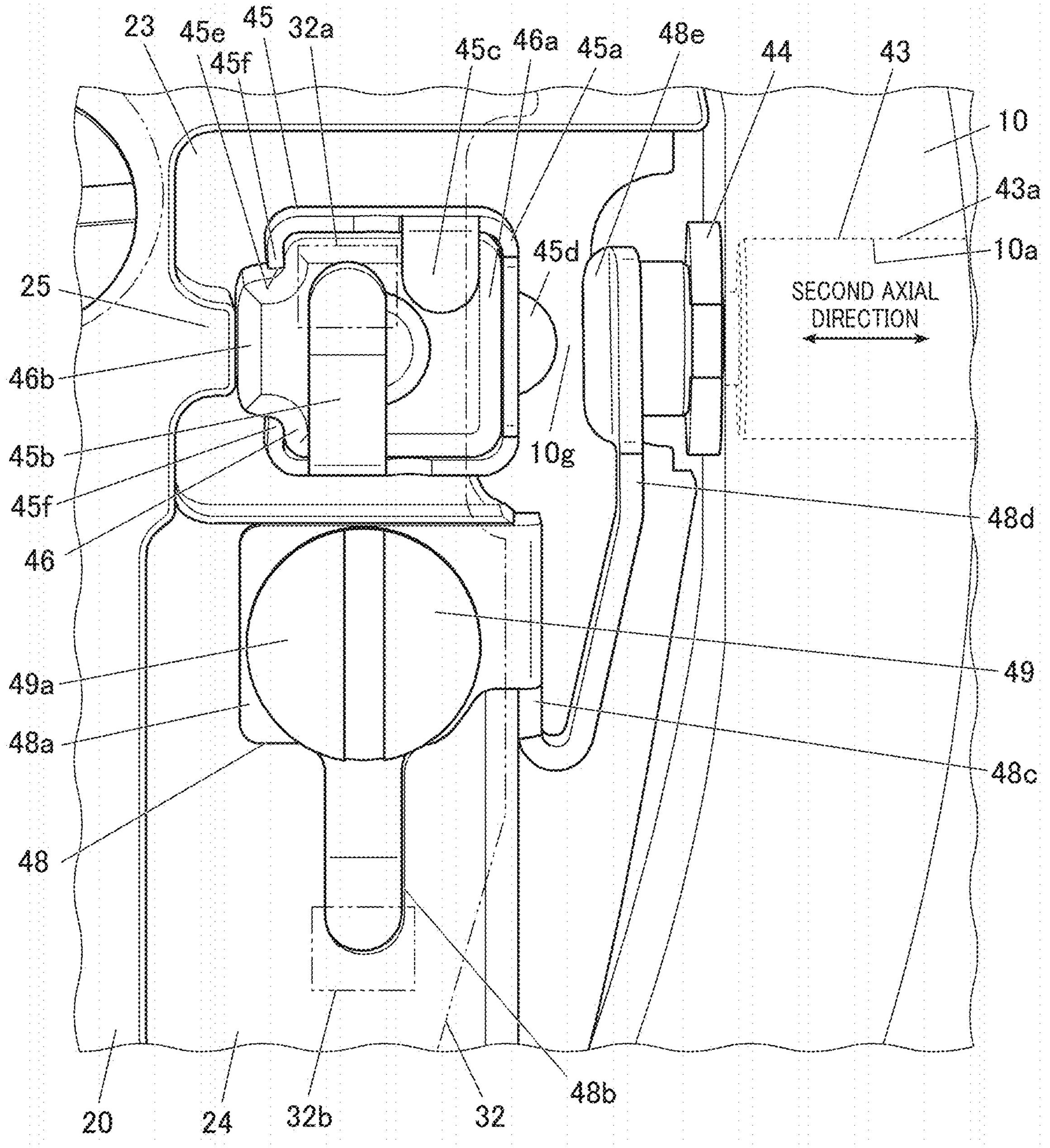
FIG. 8 is a plan view of the internals of an electronic device according to a variation.

As illustrated in FIG. 8, the shaft 43*a* of the push button 43 may be integrated with the movable contact 48. Specifically, the shaft 43*a* may be integrally installed on the leaf spring 48*d* of the movable contact 48. The shaft 43*a* may be formed integrally with the leaf spring 48*d*. In a case where the shaft 43*a* is integrated with the movable contact 48, the retaining ring 44 does not need to be provided, and the head 43*b* of the push button 43 may be installed on the shaft 43*a*.

While embodiments are described above, the technical scope of the present disclosure is not limited to the embodiments described above, and is defined on the basis of the scope of the claims. Furthermore, the technical scope of the present disclosure also includes equivalent scopes resulting from adding changes unrelated to the essence of the present disclosure to the language in the claims.

The invention claimed is:

1. An electronic device, comprising: a case;

a ground conductor plate that is accommodated in the case;

a push button that penetrates the case from an outer surface of the case through to an inner surface of the case, and is slidable in a direction of penetration;

a fixed contact that is fastened to the ground conductor plate inside the case and is disposed in front of the push button;

an electrical insulator that is interposed between the ground conductor plate and the fixed contact and electrically insulates the fixed contact from the ground conductor plate; and a movable contact that is electrically connected to the ground conductor plate, and is pushed against the fixed contact by the push button being pushed toward inside the case;

a circuit board that overlaps the ground conductor plate, wherein the circuit board has a first terminal pad and a second terminal pad that are formed on a surface of the circuit board, the surface facing the ground conductor plate, and the fixed contact is electrically connected to the first terminal pad, and the movable contact is electrically connected to the second terminal pad.

2. The electronic device according to claim 1, wherein the ground conductor plate has a recess on a surface of the ground conductor plate that faces the circuit board, the recess reaches an outer circumference of the ground conductor plate, and opens at the outer circumference of the ground conductor plate, the recess is disposed in front of the push button, the electrical insulator is fastened to a bottom of the recess, and the fixed contact is separated from the bottom and an inner surface of the recess due to the fixed contact surrounding the electrical insulator and the fixed contact being supported by the electrical insulator.

3. The electronic device according to claim 2, wherein the fixed contact has a frame that is formed into a frame shape, surrounds the electrical insulator, and hugs the electrical insulator, and a hook that supports the frame on the electrical insulator such that the frame is separated from the bottom of the recess, due to the hook being extended from the frame, bent towards inside the frame, and hooked onto the electrical insulator.

4. The electronic device according to claim 3, wherein the hook is in contact with the first terminal pad.

5. The electronic device according to claim 3, wherein the electrical insulator has a body that is block-shaped, and a protrusion that projects from the body to a side opposite to the push button in relation to the body, the frame surrounds the body, the frame has a slit that goes from inside the frame to outside the frame, and the protrusion is in contact with the inner surface of the recess through the slit.

6. The electronic device according to claim 5, wherein a portion of the inner surface of the recess that is in contact with the protrusion is provided in a protruding shape.

7. The electronic device according to claim 5, further comprising a fastening pin, wherein the electrical insulator includes a through hole that penetrates the body from a surface of the body facing the bottom of the recess to an opposite surface of the body, and the fastening pin is inserted into the through hole and fastened to the bottom of the recess.

8. The electronic device according to claim 2, wherein the ground conductor plate has a second recess that is recessed from the surface of the ground conductor plate, the surface facing the circuit board, the second recess reaches the outer circumference of the ground conductor plate, and opens at the outer circumference of the ground conductor plate, the second recess and the recess are mutually close and line up along the outer circumference of the ground conductor plate, and the movable contact is fastened to a bottom of the second recess, the movable contact juts out and is bent toward the outer circumference of the ground conductor plate from the bottom of the second recess, the movable contact is folded back toward a space between the push button and the fixed contact following the outer circumference of the ground conductor plate, and the movable contact is inserted between the push button and the fixed contact.

9. The electronic device according to claim 8, wherein the movable contact has a base that is fixed to the bottom of the second recess and is electrically connected to the bottom of the second recess, a side support that is bent from the base toward the outer circumference of the ground conductor plate, and faces the outer circumference of the ground conductor plate, and a leaf spring that extends from the side support along the outer circumference of the ground conductor plate and is inserted into the space.

10. The electronic device according to claim 9, wherein the leaf spring is folded back from the side support toward the space.

11. The electronic device according to claim 1, wherein the movable contact is disposed between the push button and the fixed contact, and the movable contact separates from the fixed contact in response to release of pushing of the push button.

* * * * *